(12) United States Patent
Brey et al.

(10) Patent No.: US 6,751,847 B1
(45) Date of Patent: Jun. 22, 2004

(54) LASER-ASSISTED FABRICATION OF NMR RESONATORS

(75) Inventors: William W. Brey, Tallahassee, FL (US); Susan D. Allen, Tallahassee, FL (US)

(73) Assignee: FSU Research Foundation, Inc., Tallahassee, FL (US)

( * ) Notice: Subject to any disclaimer, the term of this patent is extended or adjusted under 35 U.S.C. 154(b) by 180 days.

(21) Appl. No.: 09/707,126

(22) Filed: Nov. 6, 2000

Related U.S. Application Data

(60) Provisional application No. 60/163,402, filed on Nov. 4, 1999.

(51) Int. Cl.[7] ................................................. H01F 7/06
(52) U.S. Cl. ........................... 29/606; 29/602.1; 29/847; 324/318; 324/319; 336/183
(58) Field of Search ................. 29/605, 606, 602.1, 29/25.42, 847, 610.1, 611, 612, 592.1, 600, 601, 602.01, 603.01, 603.13, 603.15, 603.16, 603.25, 324, 322, 422; 324/319, 318; 336/223, 182, 183, 186, 188, 187

(56) References Cited

U.S. PATENT DOCUMENTS

| | | | | |
|---|---|---|---|---|
| 3,086,184 A | * | 4/1963 | Nichols | 336/60 |
| 3,699,550 A | * | 10/1972 | Spain | 365/136 |
| 3,735,293 A | * | 5/1973 | Breitenbach | 333/237 |
| 3,864,648 A | * | 2/1975 | McVickers | 333/163 |
| 3,911,332 A | * | 10/1975 | Kunkel | 361/270 |
| 4,368,407 A | * | 1/1983 | Wroblewski | 315/291 |
| 4,694,283 A | | 9/1987 | Reeb | |
| 4,845,586 A | * | 7/1989 | Blickstein | 391/292 |
| 4,870,742 A | * | 10/1989 | Roloff | 29/33 S |
| 4,885,539 A | * | 12/1989 | Roemer et al. | 324/318 |
| 5,084,311 A | * | 1/1992 | Liu et al. | 428/35.8 |
| 5,172,389 A | * | 12/1992 | Horiuchi et al. | 372/87 |
| 5,276,398 A | | 1/1994 | Withers et al. | |
| 5,367,261 A | * | 11/1994 | Frederick | 324/318 |
| 5,466,480 A | | 11/1995 | Zhou et al. | |
| 5,565,778 A | | 10/1996 | Brey et al. | |
| 5,594,342 A | | 1/1997 | Brey et al. | |
| 5,619,140 A | | 4/1997 | Brey et al. | |
| 5,650,670 A | * | 7/1997 | Thaxter | 307/106 |
| 5,681,006 A | * | 10/1997 | Herd et al. | 243/447.1 |
| 5,932,492 A | * | 8/1999 | Hahm et al. | 438/737 |
| 6,087,832 A | | 7/2000 | Doty | |
| 6,097,188 A | | 8/2000 | Sweedler et al. | |
| 6,118,274 A | | 9/2000 | Roffmann et al. | |
| 6,221,297 B1 | * | 4/2001 | Lanoue et al. | 264/219 |

FOREIGN PATENT DOCUMENTS

JP          362229904 A  * 10/1987 ................ 29/602.1

\* cited by examiner

*Primary Examiner*—I Cuda Rosenbaum
*Assistant Examiner*—Marc Jimenez
(74) *Attorney, Agent, or Firm*—Senniger, Powers, Leavitt & Roedel

(57) ABSTRACT

A detection coil for use in nuclear resonance magnetic (NMR) spectroscopy and a method of manufacture thereof. At least two film layers of material are deposited on an outer surface of a cylindrical tube of dielectric material. The layers are patterned to form a solenoid on the tube. At least one of the deposited materials is a conductor.

17 Claims, 5 Drawing Sheets

LASER-ASSISTED FABRICATION OF NMR RESONATORS

CROSS-REFERENCE TO RELATED APPLICATION

This application claims the benefit of commonly assigned Provisional Patent Application Serial No. 60/163,402, filed Nov. 4, 1999, the entire disclosure of which is incorporated herein by reference.

BACKGROUND OF THE INVENTION

The present invention relates generally to fabrication of coils for use in nuclear magnetic resonance (NMR) spectrometers and, particularly, to a method of fabricating such coils employing beam techniques to deposit and/or pattern the coils directly onto cylindrical dielectric tubes.

NMR spectroscopy is a valuable tool for chemical analysis. Conventional NMR spectrometers use radio frequency (RF) detection coils ranging from several millimeters to tens of centimeters in diameter to couple energy to sample volumes. In general, the coils couple energy, in the form of a rapidly alternating magnetic field, both into and out of the samples of interest. The coil transmits energy to the sample for exciting it from its equilibrium state to an excited state and receives energy from the sample as it relaxes from the excited state to the equilibrium state. Coil quality affects the observed signal-to-noise ratio and, thus, determines in large part the chemical sensitivity and resolution of the spectrometer.

Conventional coils are made from copper or silver to minimize electrical loss. A drawn wire or foil is wound or formed into the appropriate shape, usually on the surface of a thin, dielectric tube. If the demands of chemical resolution are not particularly severe, as in solid-state NMR, conductor materials thick enough to be self-supporting without the dielectric tube are typically used. In order to further improve the chemical resolution, measures are often taken to reduce the effective susceptibility of the wire or foil. Such measures include coating a paramagnetic material with a diamagnetic one (e.g., plating a copper wire with a layer of rhodium). Outside the wire or foil, the magnetic effects of the two materials will tend to cancel each other.

Although refinements of the general approach for manufacturing RF detection coils are known, further improvements are still desired. For example, a coil for use in NMR can be patterned onto a flexible circuit board. Wrapping the circuit board around a rigid dielectric cylinder forms the coil. This allows for better control of the conductor positions. The limited radius of curvature of the flexible circuit board, however, limits the minimum radius that can be used. Further, constructing a coil in this manner may require overlapping the dielectric and bonding the electrical traces together where the two ends of the board are joined together. In doing so, magnetic distortions and RF losses may result.

Those skilled in the art are also familiar with suspending an NMR coil in a material that matches the susceptibility of the foil or wire conductor. Use of a large container of liquid or solid plug of material allows the magnetic discontinuity to be moved far from the sample region. Note that the matching material should be free of any nuclei desired for NMR observation. To allow better access for pulsed field gradient coils, temperature control, and so forth, the container or plug must be fairly small, which requires that the shape of the container or plug be contrived to reduce the production of magnetic distortion.

Oxide superconductive RF coils have been patterned directly onto flat, dielectric substrates. By patterning the superconductor into thin strips parallel to the direction of current flow, the magnetic field distortion produced by persistent currents is minimized. This also enables the use of the material in high-resolution NMR applications. The fine resolution available with photolithography also allows the use of interdigital capacitors with high capacitance density. In turn, low resonant frequencies may be achieved using a single-layer process and no lossy external connections. However, flat coils have a much lower filling factor for the cylindrical samples required for NMR analysis and, without use of a superior conductor, yield much poorer chemical sensitivity and have an undesirable RF field profile.

U.S. Pat. Nos. 5,276,398, 5,466,480, 5,565,778, 5,594,342, and 5,619,140, the entire disclosures of which are incorporated herein by reference, disclose magnetic resonance probe coils and methods of making such coils.

In view of the foregoing, a more flexible and effective method for manufacturing relatively small NMR coils and NMR microcoils is desired.

SUMMARY OF THE INVENTION

The invention meets the above needs and overcomes the deficiencies of the prior art by providing an method of fabricating, or constructing, a detection coil for use in an NMR spectrometer. Among the several objects and features of this invention is the provision of such method that permits construction of a coil having signal-to-noise ratio characteristics for improving chemical sensitivity and resolution of the spectrometer; the provision of such method that reduces the effective susceptibility of the coil; the provision of such method that reduces magnetic distortions and RF losses; the provision of such method that permits construction of relatively small detection coils; the provision of such method that achieves a resonant frequency applicable to the particular design; and the provision of such method that is economically feasible and commercially practical.

Briefly described, a method embodying aspects of the invention includes steps for fabricating a detection coil for use in NMR spectroscopy. The method includes depositing a layer of conductive material on an outer surface of a generally cylindrical tube of dielectric material and then patterning the layer into a solenoid around the outer surface of the dielectric tube.

In another embodiment, a method of fabricating a detection coil includes the steps of depositing a first layer of material on an outer surface of a generally cylindrical tube of dielectric material and depositing a second layer of material on an outer surface of the first layer. In this method, one or more of the first and second layers of materials are a conductive material. The method also includes patterning the deposited first and second layers into a solenoid around the outer surface of the dielectric tube.

Yet another embodiment of the invention is directed to a method of fabricating a detection coil for use in NMR spectroscopy. The method includes depositing a layer of conductive material on an outer surface of a generally cylindrical tube of dielectric material and patterning the layer into an interdigital capacitor around the outer surface of the dielectric tube. The capacitor has a longitudinal tie bar portion and a plurality of fingers connected to and extending from the tie bar.

A detection coil embodying aspects of the invention includes a generally cylindrical tube of dielectric material having first and second film layers of conductive material deposited on its outer surface. The first and second layers each have a magnetic susceptibility of opposite sign with respect to the other and are patterned to form a solenoid around the outer surface of the dielectric tube.

Alternatively, the invention may comprise various other methods and systems.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF PREFERRED EMBODIMENTS

Figure 1:
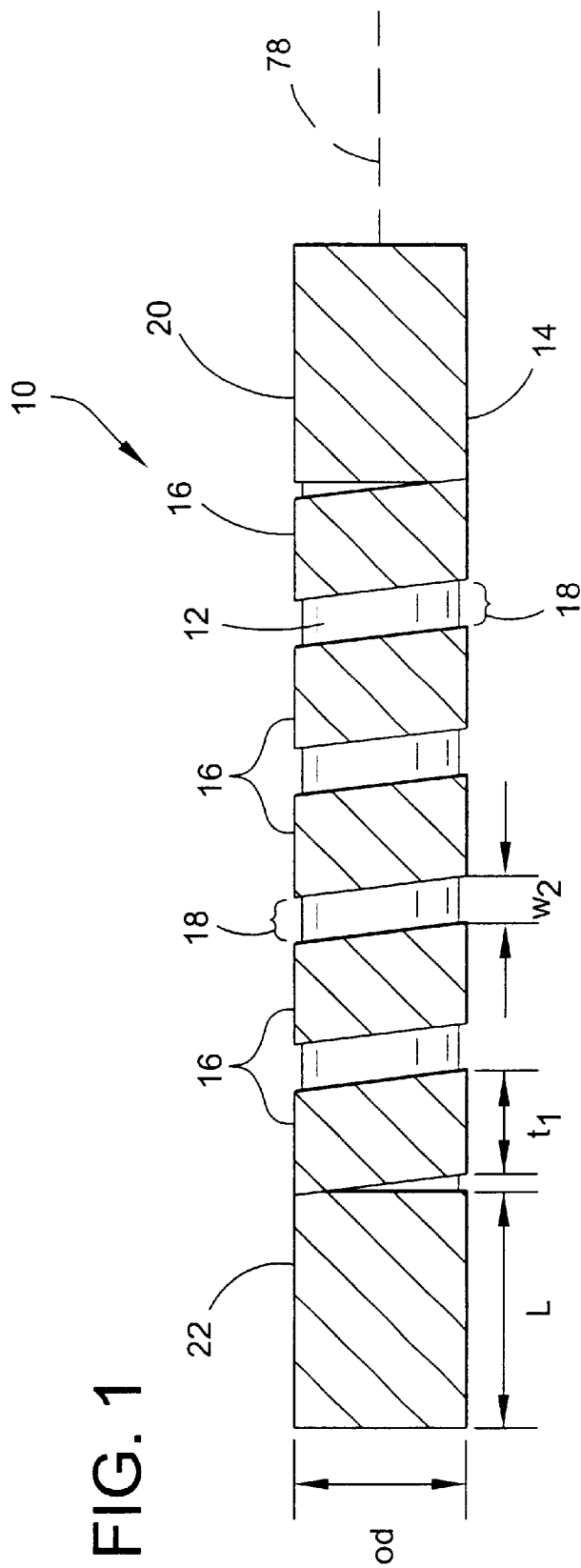
FIG. 1 is an elevational view of a solenoid for use in an NMR spectrometer.

Referring now to the drawings, the present invention provides a flexible and effective method for manufacturing relatively small NMR coils and NMR microcoils by depositing and patterning layers of metal and dielectric directly onto a generally cylindrical dielectric form.

FIG. 1 illustrates a solenoidal structure or solenoid, generally indicated at 10, according to a preferred embodiment of the invention. As used herein, the term "solenoid" refers to an NMR resonator having a generally solenoidal or coil structure and is not limited to a cylindrical coil of wire wound in the form of a helix. The solenoid 10 is formed on a generally rigid, hollow tube 12 made from a dielectric material and has an outer diameter od. A conductor 14 is first deposited onto the tube 12 and then patterned into a solenoidal structure.

Fine scale patterning is most often accomplished by photolithography, but conventional photolithography cannot be applied to the curved surfaces of the generally cylindrical surfaces of the present invention. Beam patterning can be used in direct write or partial projection mode to make such structures, however. In direct write beam patterning, the laser, ion or electron beam is focused onto the surface of the generally cylindrical surface of tube 12, which has preferably been coated with the desired conductor layer structure and an appropriate resist material. The beam cures the resist material such that it either can be removed or cannot be removed (depending on the type of resist material) once irradiated. The beam is translated over the surface of the generally cylindrical surface in a manner to generate the desired pattern. The resist is then developed, removing the resist in the areas where conductor patterns are not desired. Using standard resist and thin film processing techniques, the conductor layer structure is removed from those areas uncoated by resist, leaving a resonator pattern. The protective resist on top of the resonator pattern is then removed by standard techniques. Alternatively, multiple beams or a small portion of a projected pattern could be scanned over the generally cylindrical surface.

Beam deposition patterning is well-suited to this application. Laser deposition and patterning are particularly attractive as they can be employed in non-vacuum conditions and the relatively long depth of field offered by laser optics allows easier interaction with the curved and possibly irregular surface of an NMR coil, such as solenoid 10. Those skilled in the art recognize a number of beam techniques that may be applied, including laser direct deposition of an electroless plating catalyst seed layer, laser, electron or ion beam patterning of photoresist applied to a conventionally deposited multilayer film structure, and laser or ion beam direct writing of the conductor patterns.

In the illustrated embodiment, solenoid 10 has N turns 16. Of the turns 16, each turn i has width $t_i$ and is separated from turn i+1 by a gap 18 of width $w_i$. It is contemplated to vary the turn width $t_i$ and the gap width $w_i$ to achieve a desired current distribution for solenoid 10. A pair of end rings 20, 22 of length L provide conductor at either end of solenoid 10 to facilitate electrical connections. The rings 20, 22 also provide shielding for solenoid 10 from sample material under inspection that is outside a desired sample volume by eliminating signal from regions of nonuniform RF field. Preferably, electrical connection are made to low-inductance metal pads by soldering or another known form of bonding.

As an example, solenoid 10 has the following dimensions: od=2 mm; $t_i$=100 μm (wherein i=1 to N); $w_i$=500 μm (where i=1 to N); L=1 mm; and N=5.

Figure 2:
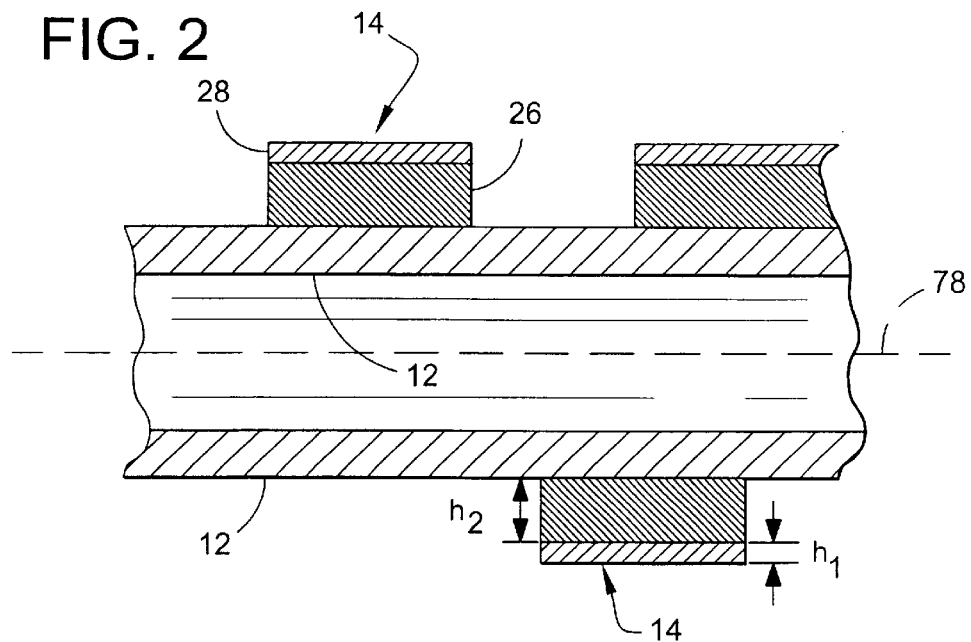
FIG. 2 is a cross sectional, fragmentary view of the solenoid of FIG. 1 according to a preferred embodiment of the invention.

Referring now to FIG. 2, conductor 14 is preferably made up of at least two film layers of conductive metal deposited onto tube 12 in such a way as to cancel the magnetic distortion caused by the conductor 14. The metal layers of conductor 14 that make up the turns, or coils, 16 are deposited in such a way as to minimize their effect on the NMR lineshape resulting from the chemical analysis of the sample. Depositing two or more layers of metal in the manner described below accomplishes this beneficial result. In the fragmentary, cross sectional view of FIG. 2, a first layer of material 26 and a second layer of material 28 (shown collectively in FIG. 1 at reference character 14) are deposited sequentially on dielectric tube 12 and then patterned to form turns 16. Each material 26, 28 preferably has a magnetic susceptibility of opposite sign with respect to the other. Inasmuch as current will tend to flow preferentially along the inside of solenoid 10 to minimize the self-inductance, the entire inner layer, i.e., material 26, is preferably made from the more conductive material of the two.

The ratio of thickness of the two materials 28, 26, shown in FIG. 2 as $h_1$ and $h_2$, respectively, determines the effect of conductor 14 on the NMR lineshape. For this reason, the ratio $h_1$:$h_2$ is carefully controlled in solenoid 10 of the invention. In a preferred embodiment of the invention, both materials 26, 28 are metal. In an alternative embodiment, however, one of the materials 26, 28 may be a dielectric (e.g., paramagnetic dielectrics such as $CeO_2$ or $Ti_2O_3$) to allow the use of a single metal optimized for conductivity.

Rhodium and copper are suitable conductors for use in constructing solenoid 10. In cgs units, the volume susceptibility for copper is approximately −0.768 whereas the volume susceptibility for rhodium is approximately +13.344. As an example, material 26 is copper deposited at a thickness of $h_2$=13.344 μm and material 28 is rhodium deposited at a thickness of $h_1$=0.768 μm. In another preferred embodiment, a high temperature superconductor is contemplated for use as conductor 14.

Figure 3:
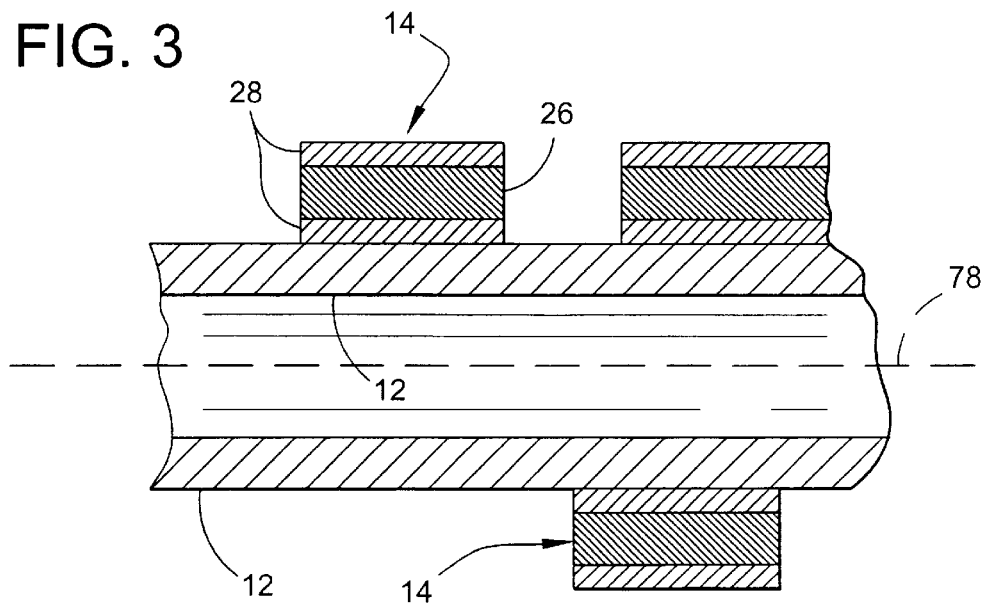
FIG. 3 is a cross sectional, fragmentary view of the solenoid of FIG. 1 according to another preferred embodiment of the present invention.

FIG. 3 shows yet another preferred embodiment of a solenoid constructed according to the present invention. In FIG. 3, conductor 14 has a three-layer structure of alternating materials 28, 26, 28 deposited on dielectric tube 12 and then patterned to form a plurality of turns 16. The three-layer structure allows for improved cancellation of lineshape distortion and, in cases where both materials 26, 28 are metal, for better RF electrical conductivity. In the illustrated embodiment, the RF current will tend to concentrate in the inner layer material 28, so it is preferably either very thin compared to the skin depth or the more conductive metal of the two. Although described in connection with one, two, or three layers of material deposited onto tube 12 and patterned to form an NMR resonator, it is contemplated that more than three layers may be employed without deviating from the scope of the invention.

Figure 4:
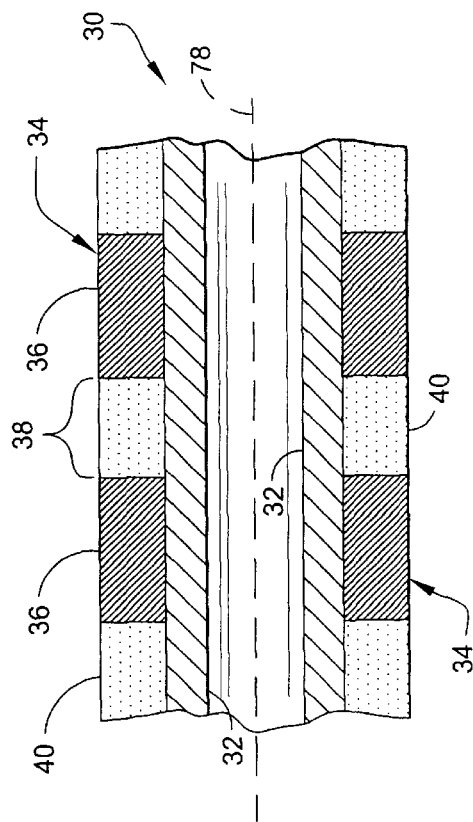
FIG. 4 is a cross sectional, fragmentary view of the solenoid of FIG. 1 according to yet another preferred embodiment of the present invention.

Referring now to FIG. 4, a solenoid 30 embodying aspects of the present invention also reduces the lineshape distortion. In this embodiment, a generally cylindrical, hollow, dielectric tube 32 is deposited with a single layer of conductive material 34. As before with conductor 14, the conductor 34 is patterned to form a plurality of turns 36, the turns 36 being separated by a gap 38. Those skilled in the art recognize that a uniform magnetic field will be present inside a cylinder oriented perpendicularly to a uniform magnetic field. This property allows the omission of compensation for the dielectric cylinder 32 on which the coil or solenoid 30 is made. Therefore, the NMR lineshape can also be improved even when a single layer of conductive material 34 is deposited onto tube 32 by filling the space between the turns 36, shown as gap 38 in FIG. 4, with a dielectric material 40. Preferably, the dielectric material 40 closely matches the susceptibility of the conductor 34.

Figure 5B:
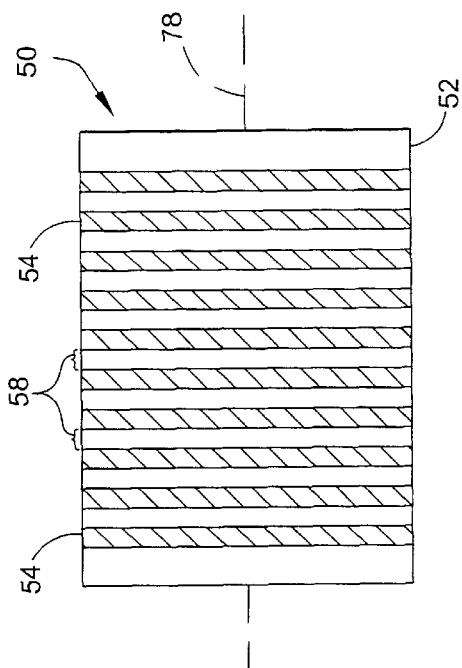
FIGS. 5A and 5B are a top view and a bottom view, respectively, of a single-turn solenoid with interdigital capacitance according to a preferred embodiment of the invention.
Figure 5A:
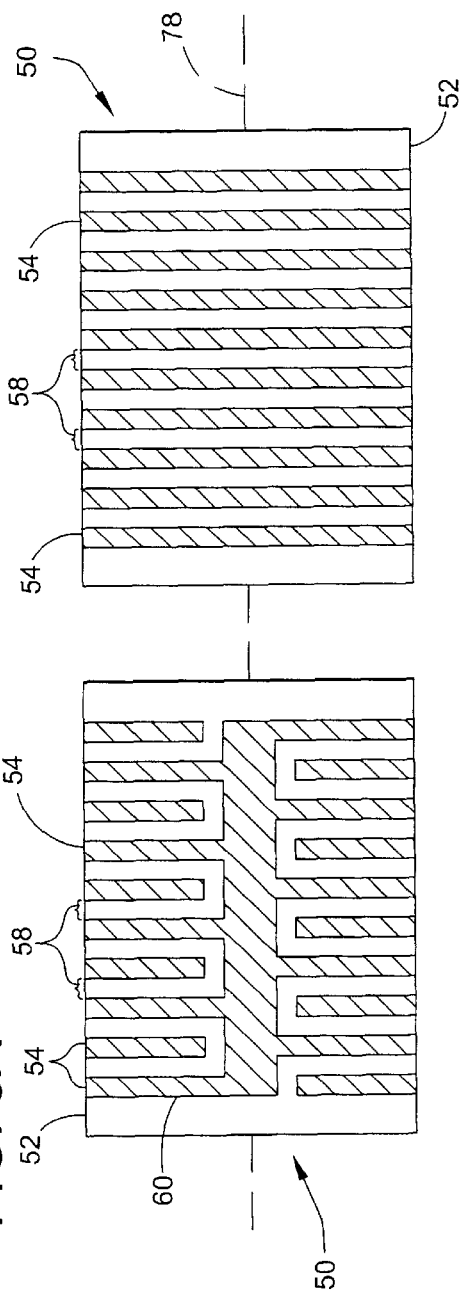

The coils 10, 30 described above are intended for use well below their self-resonant frequencies and can be modeled generally as inductors. In order to couple energy efficiently to or from these solenoids, additional reactive elements are preferably introduced for matching, usually in the form of transmission lines or capacitors. A preferred embodiment of the present invention incorporates at least some of the matching elements into the coil structure itself by, for example, fabricating such elements through a single-layer process. FIGS. 5A and 5B illustrate yet another coil 50 embodying aspects of the invention. The coil 50 includes an integral, interdigital capacitor patterned on a tube 52. In the illustrated embodiment, the conductive material 34 is deposited onto the tube 52 and patterned to form the capacitor, i.e., a plurality of fingers 54 separated by a gap 58. As shown, in FIG. 5A, a tie bar 60 connects the fingers 54. The self-resonant structure of coil 50 tends to distribute current evenly along the z-axis due to the interdigital capacitor. By varying the widths of gap 58 and/or fingers 56, it is possible to adjust the current distribution as desired to improve the magnetic field uniformity in the coil.

Although FIG. 5A illustrates a single tie bar 60, it is to be understood that any number of tie bars 60 could be used without deviating from the scope of the invention. In general, the number of tie bars 60 will leave the inductance unchanged but increase the total series capacitance by n2, where n is the number of tie bars 60. Thus, the resonance frequency is directly proportional to the number of tie bars 60. Increasing the number of tie bars 60 also tends to decrease the stray electric field, and is therefore desirable. Since it is possible to increase the resonance frequency of coil 50 almost without bound, the design is particularly well-suited for high frequencies.

Figure 6:
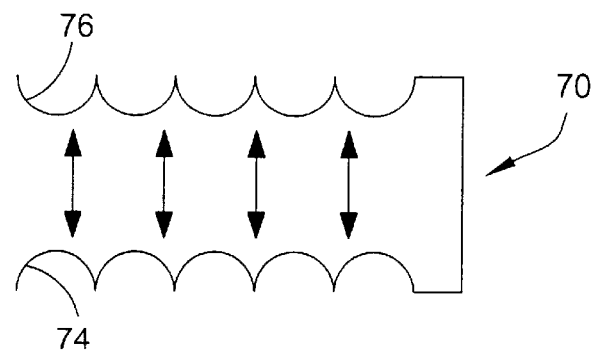
FIG. 6 is a schematic of a counterwound solenoid according to a preferred embodiment of the invention.

FIG. 6 illustrates yet another NMR coil 70 constructed on a dielectric tube 72 (see FIG. 7) in schematic form. In FIG. 6, a first solenoid 74 and a second solenoid 76, both shown schematically as inductors, are connected at one end and arranged so that they are coupled both electrically and magnetically to form a self-resonant structure. The double arrows in FIG. 6 indicate the electric and magnetic coupling between solenoids 74, 76. For relatively small coils, the capacitance density that can be achieved with a single-turn design may not be sufficient to achieve the NMR resonance frequency. Those skilled in the art are familiar generally with the use of multi-turn designs that can be used to reduce the frequency in such cases. Advantageously, the present invention employs multiple layers of conductor to produce a relatively large electric field between parallel sheets of conductor, thereby decreasing the resonance frequency.

Figure 7:
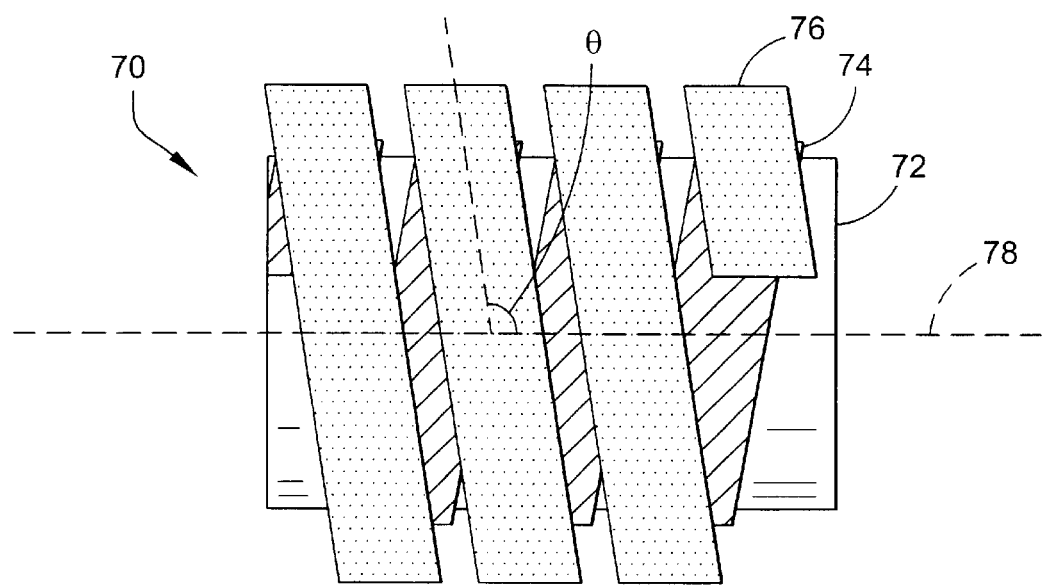
FIG. 7 is a side view of the counterwound solenoid of FIG. 6.

If the inner and outer solenoids 74, 76 are wound in opposite directions (i.e., counterwound), as shown in FIG. 7, the magnetic fields of solenoids 74, 76 will tend to add. According to the invention, the pitches of the counterwound solenoids are adjusted to cancel the electric field. This is a desirable attribute for an NMR coil. FIG. 7 also includes an axis 78 central to the hollow, dielectric tube 72 for illustrating an exemplary winding angle θ relative the axis 78.

Figure 8:
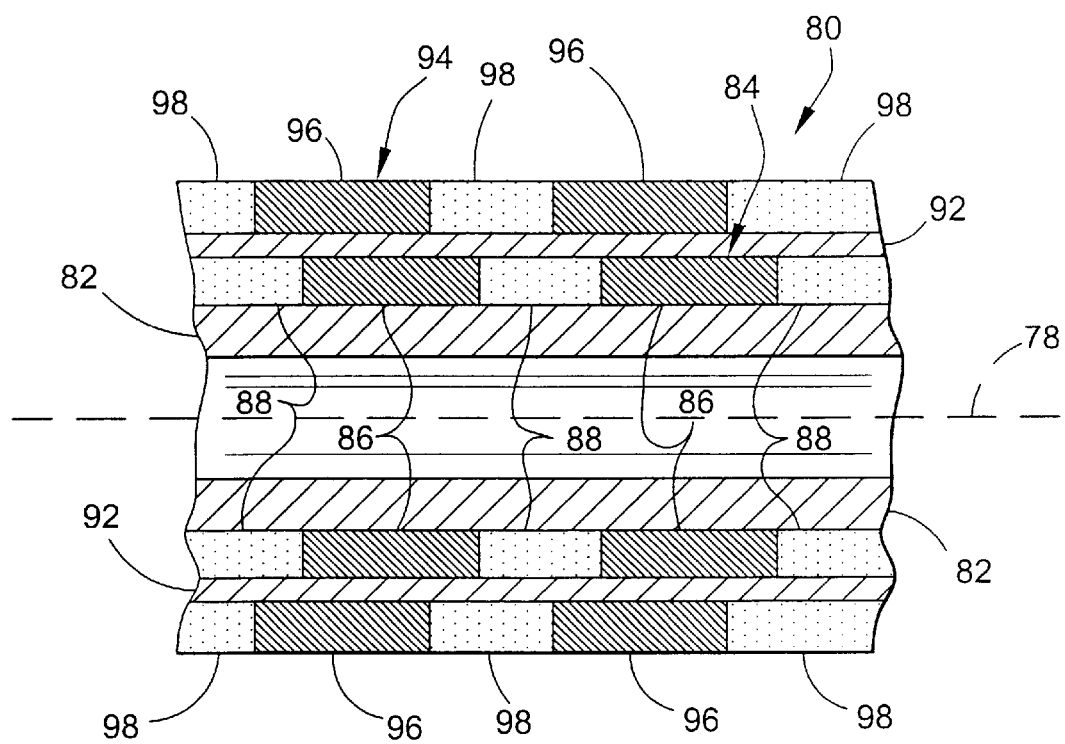
FIG. 8 is a cross sectional, fragmentary view of the counterwound solenoid of FIG. 6.

FIG. 8 illustrates yet another NMR coil, or solenoid, 80 embodying aspects of the present invention. As shown, the solenoid 80 is a counterwound solenoid of the general type shown in FIG. 7 made up of layers of material deposited on a generally cylindrical, hollow, dielectric tube 82. An inner solenoid 84 includes a plurality of conductive traces or turns 86. In this embodiment, a dielectric 88 is placed between the turns 86. A dielectric layer 92 separates and insulates the inner solenoid 84 from an outer solenoid 94. The outer solenoid 94 preferably has a plurality of conductive traces or turns 96 and, in one embodiment, has a dielectric material 98 placed between the turns 96. It is contemplated to vary the pitch of the inner and outer solenoids 84, 94 to achieve a desired current distribution for improving the magnetic field uniformity in the coil.

It is to be understood that NMR resonators constructed according to the present invention have general applicability to a wide range of frequencies. The frequency of a particular design is related to the overall size of the coil, the dielectric constant of the underlying cylinder, and the resolution of the patterning technique. However, the opportunities to modify these parameters are generally limited. For example, in an NMR spectrometer, the coil size is determined by the size of the sample. The following provides examples of appropriate designs for low and high frequency resonant coils.

With respect to microcoils, for some applications, it may be desirable to make free-standing microcoils. This can be accomplished by stereolithography using the appropriate source material and laser. In stereolithography, a precursor material is sintered, decomposed or cured only in the laser irradiated area. Translation of the reaction zone using three dimensional control can produce complex three dimensional structures. Precursors such as metal particles in a polymer or other binder, which would be removed in a subsequent firing/sintering step, solid, liquid, or gaseous metal precursors or others could be used.

In view of the above, it will be seen that the several objects of the invention are achieved and other advantageous results attained.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A method comprising:
   depositing a first layer of conductive material on an outer surface of a generally cylindrical tube of dielectric material, said dielectric tube having a longitudinal central axis;
   depositing a second layer of conductive material directly on an outer surface of the first layer of conductive material deposited on the outer surface of the dielectric tube, said first layer of conductive material having a greater conductivity than said second layer of conductive material, said first layer of conductive material and said second layer of conductive material each having a magnetic susceptibility of opposite sign with respect to each other;
   depositing a third layer of conductive material directly on an outer surface of the second layer of conductive material, said third layer of conductive material having a greater conductivity than said second layer of conductive material, said third layer of conductive material and said second layer of conductive material each having a magnetic susceptibility of opposite sign with respect to each other; and
   beam patterning the first, second, and third layers of conductive materials deposited on the dielectric tube into a solenoid, said solenoid having a plurality of turns around the outer surface of the dielectric tube and defining a detection coil for use in nuclear magnetic resonance (NMR) spectroscopy, said solenoid being patterned to generate a magnetic field within the detection coil generally parallel to the central axis when energized.

2. The method of claim 1 wherein the first layer of conductive material deposited on the dielectric tube is a metal.

3. The method of claim 1 wherein the solenoid around the outer surface of the dielectric tube defines a plurality of turns, each one of the turns being separated from another one of the turns by a gap, and further comprising the step of depositing a gap-filling layer of dielectric material in the gaps between the turns.

4. The method of claim 1 further comprising
   varying the winding angle of the solenoid to improve the magnetic field uniformity within the solenoid when the solenoid is energized.

5. The method of claim 4 wherein the first layer of conductive material has greater conductivity than the second layer of conductive material.

6. The method of claim 4 wherein the first layer of conductive material and the second layer of conductive material each have a magnetic susceptibility of opposite sign with respect to each other.

7. The method of claim 4 wherein the solenoid around the outer surface of the dielectric tube defines a plurality of turns, each pair of adjacent turns being separated by a gap, and further comprising depositing a gap-filling layer of dielectric material in the gaps between the turns.

8. The method of claim 1 wherein depositing includes laser deposition.

9. The method of claim 1 wherein the beam patterning step includes beam patterning in a direct write or partial projection mode.

10. A method comprising:
    depositing a first layer of conductive material on an outer surface of a generally cylindrical tube of dielectric material, said dielectric tube having a longitudinal central axis;
    depositing a second layer of conductive material directly on an outer surface of the first layer of conductive material deposited on the outer surface of the dielectric tube;
    depositing a third layer of conductive material directly on an outer surface of the second layer of conductive material, said first and third layers of conductive material deposited on the dielectric tube being the same conductive material; and
    beam patterning the first, second, and third layers of conductive materials deposited on the dielectric tube into a solenoid, said solenoid having a plurality of turns around the outer surface of the dielectric tube and defining a detection coil for use in nuclear magnetic resonance (NMR) spectroscopy, said solenoid being patterned to generate a magnetic field within the detection coil generally parallel to the central axis when energized.

11. The method of claim 10 wherein the first layer of conductive material has greater conductivity than the second layer of conductive material.

12. The method of claim 10 wherein the first layer of conductive material and the second layer of conductive material each have a magnetic susceptibility of opposite sign with respect to each other.

13. The method of claim 10 wherein the solenoid around the outer surface of the dielectric tube defines a plurality of turns, each pair of adjacent turns being separated by a gap, and further comprising depositing a gap-filling layer of dielectric material in the gaps between the turns.

14. A method comprising:
    depositing a first layer of conductive material on an outer surface of a generally cylindrical tube of dielectric material, said dielectric tube having a longitudinal central axis;
    beam patterning the first layer of conductive material into an inner solenoid having a plurality of turns around the outer surface of the dielectric tube, each turn of the inner solenoid defining an inner winding angle relative to the central axis of the dielectric tube, said inner solenoid being patterned to generate a magnetic field within the inner solenoid generally parallel to the central axis when energized;
    depositing an insulating layer of insulating material directly over the first layer of conductive material;
    depositing a second layer of conductive material directly on an outer surface of the layer of insulating material; and
    beam patterning the second layer of conductive material into an outer solenoid, each turn of the outer solenoid defining an outer winding angle relative to the central axis of the dielectric tube, said outer winding angle being different than the inner winding angle, said outer solenoid also being patterned to generate a magnetic field within the outer solenoid generally parallel to the central axis when energized;
    said inner and outer solenoids forming a self-resonant counter-wound structure and defining a detection coil for use in nuclear magnetic resonance (NMR) spectroscopy.

15. The method of claim 14 wherein the winding angles of the inner and outer solenoids are of substantially equal magnitude and opposite direction.

16. A method comprising:
- depositing a first layer of conductive material on an outer surface of a generally cylindrical tube of dielectric material, said dielectric tube having a longitudinal central axis;
- beam patterning said first layer of conductive material to define an inner solenoid having one or more turns and an inner winding angle relative to the central axis of the dielectric tube;
- depositing a first layer of insulating material on an outer surface of the first layer of conductive material;
- depositing a second layer of conductive material on an outer surface of the first layer of insulating material and beam patterning said second layer of conductive material to define an outer solenoid having one or more turns and an outer winding angle relative to the central axis of the dielectric tube, said outer winding angle being different than the inner winding angle, the first and second layers of conductive material being electrically connected to each other and forming a self-resonant detection coil for use in nuclear magnetic resonance (NMR) spectroscopy, said beam patterning defining said inner and outer solenoids such that said inner and outer solenoids generate a magnetic field within the detection coil generally parallel to the central axis when energized.

17. The method of claim 16, wherein the winding angle of the inner solenoid is substantially the same magnitude and opposite direction as the winding angle of the outer solenoid.

* * * * *